(12) United States Patent
Makarov et al.

(10) Patent No.: US 11,699,582 B2
(45) Date of Patent: Jul. 11, 2023

(54) COUPLING FOR CONNECTING ANALYTICAL SYSTEMS WITH VIBRATIONAL ISOLATION

(71) Applicants: Thermo Fisher Scientific (Bremen) GmbH, Bremen (DE); FEI Company, Hillsoboro, OR (US)

(72) Inventors: Alexander Makarov, Bremen (DE); Wilko Balschun, Bremen (DE); Kyle Fort, Bremen (DE); Kun Liu, Hillsboro, OR (US)

(73) Assignees: FEI Company, Hillsboro, OR (US); Thermo Fisher Scientific (Breman) GmbH, Breman (DE)

( * ) Notice: Subject to any disclaimer, the term of this patent is extended or adjusted under 35 U.S.C. 154(b) by 109 days.

(21) Appl. No.: 17/468,478

(22) Filed: Sep. 7, 2021

(65) Prior Publication Data

US 2022/0084806 A1    Mar. 17, 2022

(30) Foreign Application Priority Data

Sep. 11, 2020  (GB) ..................... 2014305

(51) Int. Cl.
  *H01J 37/02*  (2006.01)
  *H01J 49/06*  (2006.01)
(52) U.S. Cl.
  CPC ............ *H01J 49/063* (2013.01); *H01J 37/02* (2013.01); *H01J 2237/0216* (2013.01); *H01J 2237/182* (2013.01)

(58) Field of Classification Search
CPC .. H01J 37/02; H01J 37/18; H01J 37/20; H01J 37/295; H01J 2237/182; H01J 2237/0216; H01J 2237/2614; H01J 2237/05; H01J 49/063
See application file for complete search history.

(56) References Cited

U.S. PATENT DOCUMENTS

| 3,514,600 | A  | 5/1970  | Taylor         |
|-----------|----|---------|----------------|
| 4,352,643 | A  | 10/1982 | Ijima          |
| 5,376,799 | A  | 12/1994 | Schamber et al.|
| 7,993,113 | B2 | 8/2011  | Namiki et al.  |
| 8,529,218 | B2 | 9/2013  | Makarov        |
| 10,422,338| B2 | 9/2019  | Makarov et al. |
| 10,720,315| B2 | 7/2020  | Mazdak         |
| 10,840,077| B2 | 11/2020 | Mazdak         |

(Continued)

FOREIGN PATENT DOCUMENTS

| EP | 1270949 A1   |   | 1/2003 |             |
|----|--------------|---|--------|-------------|
| JP | 2007165232 A |   | 6/2007 |             |
| WO | WO-2020020462 A1 | * | 1/2020 | .......... B25J 15/0608 |

*Primary Examiner* — David E Smith
*Assistant Examiner* — Hsien C Tsai

(57) ABSTRACT

A coupling for connecting together vacuum-based analytical systems requiring to be vibrationally isolated, comprising: a tubular connector having a longitudinal axis, the connector comprising a first end for connection to a first analytical system and a flexible portion reducing transmission of vibrations and permitting displacement of the first analytical system in a direction transverse to the longitudinal axis of the connector; and a seal longitudinally separated from the flexible portion, for vacuum sealing between the connector and a second analytical system; wherein the connector contains ion optics for transmitting ions between the first and second analytical systems.

22 Claims, 6 Drawing Sheets

(56) References Cited

U.S. PATENT DOCUMENTS

| | | |
|---|---|---|
| 11,219,393 B2 | 1/2022 | Mazdak |
| 11,222,776 B1 | 1/2022 | Mazdak |
| 2012/0128484 A1 | 5/2012 | Hamochi |
| 2020/0408457 A1 | 12/2020 | Wu et al. |
| 2020/0411282 A1* | 12/2020 | Straw ..................... H01J 37/20 |

* cited by examiner

COUPLING FOR CONNECTING ANALYTICAL SYSTEMS WITH VIBRATIONAL ISOLATION

CROSS-REFERENCE TO RELATED APPLICATION

This application claims priority to UK Patent Application 2014305.3, filed on Sep. 11, 2020, and titled "Coupling for Connecting Analytical Systems with Vibrational Isolation," by Makarov et al., which is hereby incorporated by reference herein in its entirety.

FIELD OF THE INVENTION

The present disclosure relates to a coupling for connecting systems, such as vacuum-based analytical systems, wherein one requires vibrational isolation from the other. In particular, but not exclusively, the disclosure relates to a coupling for connecting a vacuum-based analytical system, such as a mass spectrometer, to a vibration-sensitive analytical system, which can also be operated under vacuum, such as an electron microscope.

BACKGROUND OF THE INVENTION

There is an increasing interest in both native-state mass spectrometry (MS) and electron microscopy (EM) of complex molecules, for example biopolymers or macromolecules, such as DNA, RNA, proteins or peptides, as well as complexes of the same. Advances in soft landing of ions has allowed for direct deposition of intact proteins, protein and protein-DNA complexes onto substrates under ultra-high vacuum and, optionally, cryogenic conditions to facilitate analysis. A system for combining mass selection by a mass spectrometer with soft landing of ions for analysis by an electron microscope has been described in U.S. patent application Ser. No. 16/914,924, filed Jun. 29, 2020, the entire contents of which are incorporated herein by reference. However, a challenge for combining mass spectrometry systems with imaging systems, such as scanning electron microscopy (SEM), transmission electron microscopy (TEM) and/or electron holography (EH) or mass spectrometry imaging (MSI) systems, is how to reconcile the very high vibration-free requirements of high-resolution imaging system and the multi-port pumping requirements of mass spectrometry that are usually provided by vibration-intensive turbomolecular pumps. Typically, these vibrations start to distort and smear images when spatial resolution reaches low-micron levels, and become unacceptable at nanometer-scale resolutions. Hence, in this disclosure, high-resolution imaging relates to all techniques that operate in this range of spatial resolutions.

This problem is exacerbated by particular features of modern SEM/TEM/EH/MSI vibration isolation systems. As such systems utilise active platforms, as well as passive air tables, the activation of some of these systems can result in substantial, for example up to 5-7 millimetres (mm) (e.g. 5 mm), vertical displacement of the imaging system (SEM/TEM/EH/MSI). As a mass spectrometer is preferably kept on a separate platform, such displacement can result in bending of ion optics connecting the two systems. It is a further requirement for combining systems that any interference of ground loops between the two systems needs to be avoided. If the aforementioned problems are not addressed, they can significantly affect the analytical performance of the imaging system.

Various solutions to vibration isolation for electron microscopes have been presented. For example, in U.S. Pat. No. 5,376,799, metal-to-metal contact between a pump and electron microscope system is avoided by using O-ring radial seals and vertical elastomeric isolation mounts. According to another approach presented in U.S. Pat. No. 7,993,113, a vibration isolator comprises a metal bellows, surrounded and separated from an elastic ring member, in which the vibration damping is tuned to create a notch filter at the vibration frequency of the turbomolecular pump. Another similar implementation using bellows is presented in U.S. Pat. No. 8,961,106, in which additionally an annular weight is disposed around the outer periphery of a connecting pumping tube with a viscoelastic member interposed between the tube and the weight to form a vibration absorber. While designed for systems having a single turbomolecular pump, the presented approaches are not compatible with multiple vibration frequencies that typically accompany a modern mass spectrometer and do not address the problem of relative movement between two analytical systems, especially with two systems horizontally connected.

Against the above background the present disclosure is provided.

SUMMARY OF THE INVENTION

Aspects of the present disclosure address the problem that vibrations need to be decoupled between analytical systems, such as a mass spectrometer system and an imaging system. Aspects of the present disclosure relate to a coupling for connecting vacuum-based analytical systems. Aspects of the present disclosure address the problem that in use vertical displacement may occur between the two analytical systems. Aspects of the present disclosure are compatible with ion optical designs in which ion optics and (ultra)-high vacuum need to span continuously between one analytical system (e.g. mass spectrometer) and another analytical system (e.g. imaging system), usually along a substantially horizontal path or line. Aspects of the present disclosure relate to a coupling for connecting a mass spectrometer and other vacuum-based instruments, particularly vibration sensitive analytical instruments, such as scanning and transmission electron microscopes (SEM/TEM), e.g. in a hybrid MS/TEM or MS/SEM configuration. Aspects of the present disclosure enable ion optical qualities of the systems to be maintained whilst providing vibration isolation and allowing relative displacement between the systems.

The disclosure enables vibrational decoupling between two systems without metal-to-metal contact between the systems. Embodiments of the disclosure provide vibrational decoupling whilst enabling an existing MS system or infrastructure to be utilized and an (ultra)-high vacuum ion path provided from the MS system to an imaging system.

The present disclosure in one aspect provides a coupling according to claim 1. Further features of the disclosure are provided according to the dependent claims.

The present disclosure in general provides a coupling for connecting analytical systems. The analytical systems are typically held under vacuum during their operation. A vacuum pump system, for example comprising at least one turbomolecular pump, can be provided to pump one or preferably both the analytical systems and maintain them under vacuum. Preferably, the analytical systems comprise multiple stages of vacuum at different pressures as exemplified in U.S. Pat. Nos. 8,529,218 and 10,422,338. The coupling comprises a tubular connector, which is typically cylindrical, having a longitudinal axis and having a flexible portion (herein a "first flexible portion"). The connector has a first end for connection to a first analytical system. The flexible portion is located at a position along the length of the connector and typically is located at or near the first end of the connector for connection to the first analytical system. The flexible portion is generally an annular portion, which extends radially or circumferentially around the longitudinal axis. The flexible portion is preferably a bellows. The flexible portion can dissipate vibrations and thus reduce or prevent their transmission to the first analytical system, or from the first analytical system if the first system is the source of vibrations. The flexible portion can permit relative displacement of the analytical systems in a direction transverse to the longitudinal axis of the connector. In embodiments, the flexible portion can permit displacement of the first analytical system in a direction transverse to the longitudinal axis of the connector. For example, the displacement can be in a vertical direction where the longitudinal axis of the connector is horizontal in use. The flexible portion may also permit relative displacement of the analytical systems in the direction of the longitudinal axis of the connector.

The coupling preferably further comprises a seal, which is preferably a radial seal, separated (i.e. longitudinally separated) from the flexible portion and for vacuum sealing between the connector and a second analytical system. The first and second analytical systems are required to be vibrationally isolated from each other (one of the analytical systems requires isolation from vibrations generated by the other system), i.e. one is a source of vibrations from which the other system is required to be isolated. For example, the first analytical system requires isolation from vibrations of the second analytical system, or vice versa.

The seal is preferably a radial seal located on the outer surface of the connector. The seal preferably seals to an inner surface of an opening or port on the second analytical system. The seal is preferably located at or proximate to a second (distal) end of the connector, opposite from the first end. The second (distal) end of the connector is for connection to the second analytical system. The seal preferably seals against atmospheric pressure, i.e. outside the analytical systems. The seal preferably seals between the atmospheric pressure outside the analytical systems and a vacuum (such as HV or UHV) inside the analytical systems. The flexible portion and optionally seal permit relative displacement of the first and analytical systems in a direction transverse to the longitudinal axis of the connector. For example, the displacement can be in a vertical direction where the longitudinal axis of the connector is horizontal. A displacement of the first analytical system can cause corresponding displacement of the first end of the connector, in particular the flexible portion thereof, to which the first analytical system is connected.

The seal preferably comprises a first seal and a second seal, preferably a first radial seal and a second radial seal. The first and second seals are preferably located at or proximate to the second end of the connector, opposite from the first end. The first seal, which is separated from the flexible portion, is a first seal for sealing between the connector and the second analytical system. The first seal is preferably located at or proximate to a second (distal) end of the connector from the first end. The first seal is preferably for sealing against atmospheric pressure, i.e. outside the analytical systems. The first seal optionally can further permit displacement of the first analytical system in a direction transverse to the longitudinal axis of the connector as described. For example, the first seal, e.g. O-ring type, preferably allows some rotation of the connector to reduce stress on the first flexible portion or bellows under elongation, otherwise such stress could start to transmit vibrations. Preferably, a second seal, which is preferably a radial seal, is provided separate from the first seal, preferably further (longitudinally) from the first flexible portion than the first seal, the second seal also being for sealing between the connector and the second analytical system. The second seal preferably is for sealing against a high vacuum (which term as used herein includes ultra-high vacuum (UHV)), i.e. the vacuum inside the analytical systems. The high vacuum can have a pressure of $10^{-3}$ mbar or lower, $10^{-4}$ mbar or lower, $10^{-5}$ mbar or lower, $10^{-6}$ mbar or lower, preferably $10^{-7}$ mbar or lower, $10^{-8}$ mbar or lower, $10^{-9}$ mbar or lower, or $10^{-10}$ mbar or lower ($10^{-9}$ mbar or lower being UHV).

In some embodiments, a space or volume between the first and second seals can be differentially pumped by a vacuum pump. In some embodiments, the space between the first and second seals can be pumped by the same pump (e.g. turbomolecular pump) as pumps the analytical systems to provide their vacuum. The internal volume of the analytical systems and the space between the first and second seals can be connected respectively to separate pumping ports of a multistage vacuum (turbomolecular) pump. Typically, the space or volume is pumped to a pressure that is intermediate between atmospheric pressure and the vacuum pressure inside the analytical systems. Advantageously, using the two seal arrangement configured with differential pumping, the coupling can seal between atmospheric pressure outside the analytical systems to UHV ($10^{-9}$ mbar or lower) inside the analytical systems. More than two seals can be used if required.

Preferably, the connector has a second flexible portion, which is located between the first seal and second seal. The second flexible portion is preferably a bellows (i.e. a second bellows in embodiments where the first flexible portion is a bellows). The second flexible portion can dissipate vibrations and vibrationally isolate the second seal from the first analytical system, whilst maintaining the sealed, pumped space between the seals. The presence of this second flexible portion may allow rotation to occur at the first seal without imposing stress on the second seal. In this way, a vertical displacement of an analytical system or connector does not affect the second seal and does not increase transmission of vibrations to the other system.

The first and second seals are preferably not using metal-to-metal seals, especially knife-edge seals of Conflat type. The first and second seals can have different stiffness to each other. Preferably, the first seal (nearest to atmosphere) has a higher stiffness than the second or other seal(s) (nearest/nearer to vacuum). At least one of the seals is an elastomer seal. The first seal can be an elastomer seal, more preferably a fluoroelastomer seal and still more preferably an FKM fluoroelastomer, e.g. Viton™, seal. The second or other seal(s) can be an elastomer or a polymer seal, preferably a fluoropolymer seal, more preferably a polytetrafluoroethylene (PTFE) seal. The first and second seals can be O-rings.

Preferably, the analytical systems are for analysing ions, e.g. which have been generated from a sample to be analysed. The ions can be transmitted to one of the analytical systems from the other, e.g. to an electron microscope system from a mass spectrometer system. Preferably, an ion optical axis, along which ions travel between the analytical systems, passes through the connector, preferably through the centre of the connector and further preferably on the longitudinal axis of the connector. Preferably, the ion optical axis and the longitudinal axis of the connector are substantially coincident.

In some embodiments, for example wherein one of the analytical systems (such as the second analytical system) is a mass spectrometer, the connector contains ion optics for guiding and/or focusing ions therethrough to reduce ion losses. The connector can house a multipole ion guide for guiding ions. The connector can also or alternatively contain one or more ion lenses for focusing ions. In some embodiments, one end of the multipole is connected to the connector, i.e. supported inside the connector, and the other end of the multipole is connected to, i.e. supported by, one of the analytical systems (e.g. supported inside the first analytical system), such that the other end of the multipole can be displaced by a displacement of the analytical system transverse to the longitudinal axis of the connector. In this way, the multipole can guide ions into the first analytical system with minimal losses. Preferably, the end of the multipole connected to the connector, i.e. supported inside the connector, is rotatably supported inside the connector. Preferably, one end of the multipole is supported inside the connector at a longitudinal position at or proximate to the first (stiffest) seal, preferably near to or in the same plane as the first seal (i.e. substantially in the same plane as the first seal). This end of the multipole is preferably rotatably supported, i.e. supported such it that permits rotation.

The rod electrodes of the multipole are preferably held in dielectric supports. The supports (typically a pair of supports) preferably hold the rods close to each end of the multipole (each end of the rods). The dielectric supports can be, e.g., made of ceramic, quartz or plastic material.

In one preferred embodiment, at least one dielectric support of the multipole is seated on a seat that is inside the connector and the support is rotatable on the seat. The seat may be fixed to or integral with the inside of the connector, e.g. the internal wall of the connector. The seat preferably can lie at a longitudinal position at or proximate to the first (stiffest) seal, preferably in the same plane as the first seal. For this purpose, a part of the dielectric support in contact with the seat can be rounded and/or polished. In some embodiments, the other dielectric support of the multipole is connected to the (vibrationally-isolated) first analytical system. In this way, the other dielectric support, and thus the other end of the multipole, moves with displacement of the first analytical system. Preferably, at least the dielectric support of the multipole at or nearest to a centre of rotation of the multipole caused by (vertical) displacement of the analytical system is rotatable (e.g. rounded and/or polished).

Preferably, the centre of rotation of the multipole during displacement lies on the longitudinal axis of the connector. The centre of rotation preferably also lies at a longitudinal position at or proximate to the first (stiffest) seal, preferably near to or in the same plane as the first seal (i.e. substantially in the same plane as the first seal). The centre of rotation is preferably near to the entrance of ions into the multipole to minimise misalignment upon displacement of systems. The multipole housed in the connector in some embodiments receives ions from an upstream multipole that is fixed inside the second analytical system, such as a mass spectrometer.

An alternative embodiment that enables alignment of multipoles in spite of relative movement of systems comprises use of a Cardan or Universal joint, which allows rotation of adjacent multipoles about two orthogonal axes without losing alignment. In one such embodiment, one end of the multipole inside the connector can be connected to a Cardan joint, e.g. can be connected to a further multipole by the Cardan joint. In such an embodiment, shafts, preferably hollow cylindrical shafts, can be attached respectively to the adjacent ends of two multipoles. One multipole can be the multipole contained inside the connector, in which case its shaft can fit within the connector. The other multipole can be a multipole of an analytical system such as a mass spectrometer. The shafts can be located about the dielectric supports of the multipoles, thereby supporting the ends of the multipoles. The shafts can be connected to a central yoke, e.g. by centering balls, preferably ceramic or metal balls, preferably with tolerances of not more than a few tens of microns. Two centering balls can be located on each orthogonal axis of rotation, so that there are four balls in total. Each shaft can be connected to the yoke by two of the balls (i.e. two balls on the same axis). The shafts are thereby able to move relative to each other about the orthogonal axes and to the yoke by means of the centering balls. In some embodiments, an ion lens can be located between the adjacent ends of the multipoles. Other means of defining the axes of rotations could be used instead of centering balls, e.g. pins or miniature bellows. However, centering balls are preferred due to lower stresses in operation. Preferably, in this case, both axes of rotation lie through the centre of the aperture of the ion lens to minimise misalignment between the multipole ends.

In order to allow longitudinal shifts of the multipoles, due to movement (compression and expansion) of the flexible portion of the coupling, the end of the multipole supported inside the first analytical system can be located with a sliding fit within a housing of the first analytical system. For example, the multipole contained inside the connector can have one end connected to the Cardan joint and the other end located in a sliding fit within a housing of the corresponding analytical system. In an embodiment, one of the multipoles could be constructed as two parts, with one multipole part rigidly fixed to the corresponding analytical system and another multipole part connected to the Cardan joint and being longitudinally moveable relative to the first multipole part. For example, the first multipole part can be fixed within a housing, e.g. by fixing its dielectric supports to the internal wall of the housing. The second multipole part can be arranged with its end adjacent the first part located within the housing in a sliding fit. Although the two multipole parts could have the same RF supply, the gap (G) between the two multipoles parts could be varied to accommodate shifts between systems. As long as the size of this shift is significantly less than the inscribed diameter, $D_0$, of the multipoles, no ion losses or ion scattering should be expected.

Since the connector has a flexible portion, which allows longitudinal movement, in some embodiments means are required to avoid collision between the multipole, which can be movable, and lens inside the connector. In some embodiments, relative movement between the analytical systems in the longitudinal direction is controlled by means of one or more stops and/or one or more proximity sensors. For example, one or more stops (i.e. blocks) can be provided. These stops can be arranged to limit maximum compression and/or maximum extension of the flexible portion. In some embodiments, one or more stops can be connected to one of the analytical systems, such as the second system, which does not move. The stop is arranged to engage, i.e. contact, a corresponding part on the other analytical system if the movement of that system exceeds a predetermined compression and/or extension of the flexible portion. The optimum distance between multipole and lens can be set during installation of the system. In some embodiments, the distance can be controlled using one or more proximity sensors, e.g. spring contacts, or capacitive, inductive, magnetic, optical and/or other sensing. The sensor(s) preferably do not allow contact between the systems, or at least not more than a low-force spring-loaded contact, so that a path for vibrations is not provided.

Preferably, a distance, L, between the centre of the first flexible portion of the connector and the first seal is such that any radial energy spread of ions caused by displacement of the first end of the connector (and thus displacement of the multipole therein) in a direction transverse to the longitudinal axis (thus producing angular misalignment between ion optics (multipoles) in the connector and upstream analytical system) is less than the radial energy spread of the ions entering the connector/multipole. For example, any additional radial energy spread of ions caused by displacement or angular misalignment is preferably <50%, <40%, <30%, <20%, <10%, <5% of the radial energy spread of the ion beam entering the connector/multipole. In some embodiments, angular misalignment between ion optics caused by displacement can be compensated with the use of one or more ions deflectors.

In some embodiments, the first analytical system, which can be an electron microscope, may require isolation from vibrations. In some embodiments, the second analytical system is a source of the vibrations (e.g. pump generated vibrations). In some embodiments, the second analytical system is a mass spectrometer. However, the configuration may be reversed such that, in some embodiments, the second analytical system may require isolation from vibrations. In some such embodiments, the second analytical system may be an electron microscope, the first analytical system may be a source of the vibrations (e.g. pump generated vibrations) and/or the first analytical system may be a mass spectrometer.

In some embodiments, the analytical systems can analyse ions. For example, a mass spectrometer may generate and select ions by their mass-to-charge ratio that are transmitted to an imaging system, such as an electron microscope. In another embodiment, ions may be generated from the sample at a plurality of sequential positions on the sample, e.g. using a scanning ion beam or laser beam, which images the sample. In the latter embodiment, the sample may be located in an analytical system that requires vibrational isolation, especially where micron and sub-micron scale image resolution is required, and the ions will pass via the coupling of the present disclosure to a mass spectrometer system for mass analysis. The ions can be ions of biopolymers, such as DNA, RNA, proteins with or without post-translational modifications, peptides, protein and DNA/RNA/protein complexes, intact viruses and the like.

In the mass spectrometer, the ions can be generated from analytes by (nano)electrospray ionisation, inlet ionisation, MALDI, desorption electrospray ionisation, ambient ion sources, etc. The mass spectrometer can comprise an ion mass selector or filter, preferably a quadrupole mass filter, to filter ions based on their mass-to-charge ratio. The mass spectrometer can be one or more of the following types: an orbital trapping analyser with quadrupole mass filter (such as Orbitrap™ Hybrid or Tribrid™ mass spectrometers), a triple quadrupole mass spectrometer, a quadrupole-Time-of-flight (Q-ToF) mass spectrometer, etc. The imaging system can be an electron microscope of one or more of the following types: SEM, TEM, electron holography microscope, diffractometry, or can be an imaging mass spectrometer using a secondary ion or laser ion source. The analytical system, such as electron microscope, can comprise a soft landing substrate for receiving ions from the mass spectrometer, for sample preparation. The substrate can comprise a graphene support. Cryogenic cooling can be utilised at one or more stage of the analysis by the analytical systems, e.g. Cryogenic cooling of the substrate or sample for electron microscopy (Cryo-EM).

In some embodiments, one of the analytical systems is a mass spectrometer and the other analytical system is an imaging system utilizing charged particles (e.g. ions), such as an electron microscope, or imaging MS. The imaging system can be selected from: a TEM, an SEM, an electron holography (EH) microscope, an imaging mass spectrometer (MSI) using secondary ion mass spectrometry (SIMS), and an imaging mass spectrometer (MSI) using lasers, such as MALDI or MALDI-2. The present disclosure accordingly provides in a particular aspect an analysis system comprising a mass spectrometer and an imaging system, wherein the mass spectrometer and the imaging system are connected by a coupling according to the disclosure.

DETAILED DESCRIPTION OF THE DRAWINGS

Various embodiments will now be described with reference to the accompanying figures. The embodiments are intended to illustrate various features of the present disclosure and are not intended to be limiting on the scope of the disclosure. It will be appreciated that variations to the embodiments can be made while still falling within the scope of the appended claims.

Figure 1:
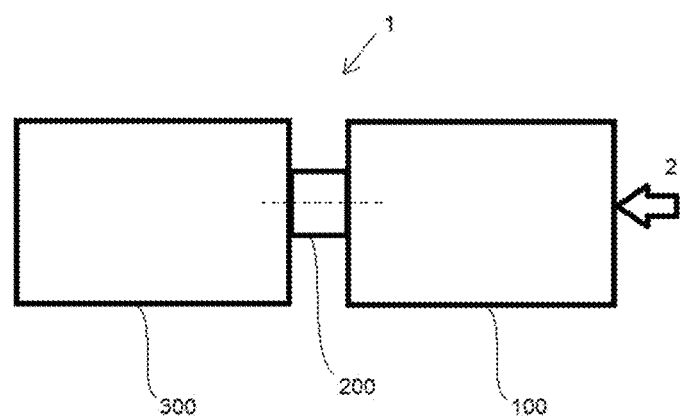
FIG. 1 shows schematically a combination or hybrid of two analytical systems.

FIG. 1 shows schematically a combination or hybrid (1) of two analytical systems (100, 300). The analytical system (100) receives and prepares a sample (2) to be analysed by the analytical system (300). The analytical system (300), which is referred to herein as the first analytical system, is an analytical system that is required to be isolated from vibrations at least during analysis. The first analytical system (300), is typically held under vacuum in use. The first analytical system (300) can be an electron microscopy (EM) system, for example or any other high-resolution imaging system. The first analytical system (300), is typically held under vacuum in use. The analytical system (100), which is referred to herein as the second analytical system, is an analytical system that is a source of vibrations, for example because the analytical system is connected to and pumped by one or more vacuum pumps that create intense vibrations. The second analytical system (100) can be a mass spectrometry (MS) system, for example. Although system (100) could be a mass spectrometry system that passes ions to an imaging system (300), in another embodiment, system (100) could be an imaging system that produces ions from precisely defined spots (e.g. using a scanning ion beam or laser beam) and passes the ions to a mass spectrometry system (300). Depending on the application, ions could be transported either from system (100) to system (300) or from system (300) to system (100). For example, ions may be produced in an imaging system (300), e.g. using a ion beam or laser beam, and passed to a mass spectrometry system (100).

In general, the coupling of the disclosure is applicable where one of the first and second analytical systems requires isolation from vibrations generated by the other system. For example, the first analytical system requires isolation from vibrations of the second analytical system as shown in the example. However, in other embodiments, it may be that the second analytical system requires isolation from vibrations generated by the first analytical system.

The second analytical system (100) may prepare the sample by generating ions in an ion source and mass selecting ions of interest using a mass selector, for example a quadrupole mass filter or a mass selective ion trap. In this way, sample ions of a specific mass-to-charge ratio or within a specific range of mass-to-charge ratios are selected in the second analytical system (100) and can be guided by ion optics into the analytical system (300). Sample can be received in the first analytical system (300) from the second analytical system (300), for example, by an ion soft landing technique, which is suitable when the first analytical system (300) is an electron microscopy (EM) system.

The analytical systems (100, 300) are connected by a coupling (200), which is the subject of the present disclosure and described in more detail below.

Figure 2:
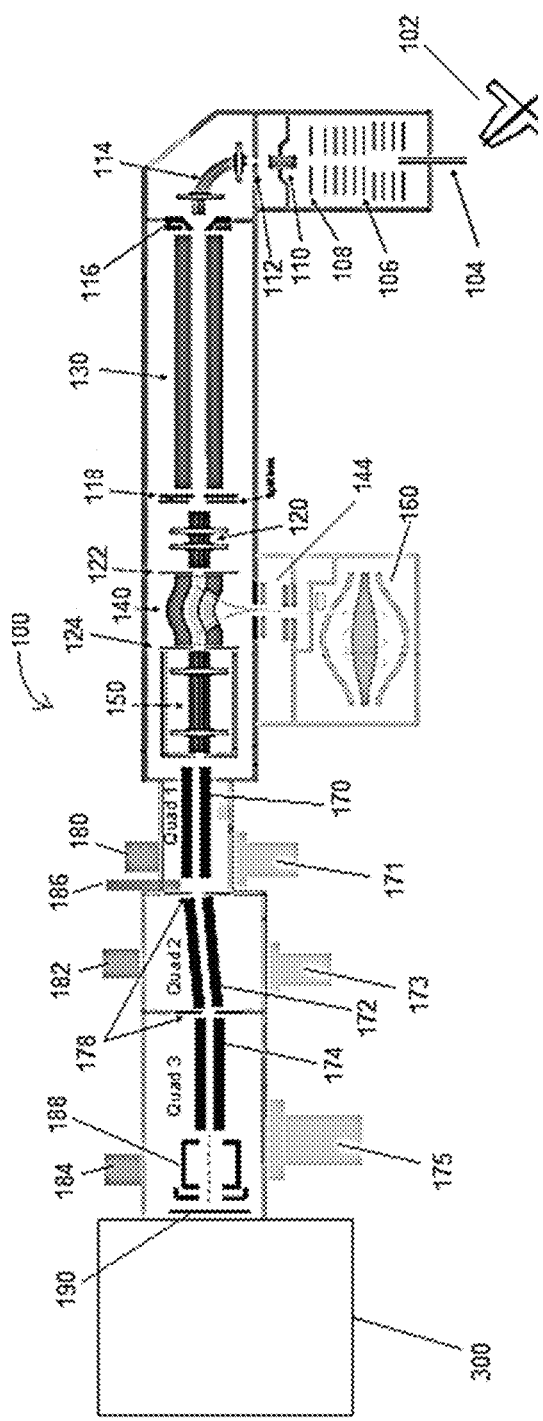
FIG. 2 shows schematically an embodiment of a mass spectrometer system that can be used to provide ions to a further analytical system.

FIG. 2 shows schematically a configuration of a mass spectrometer system (100) that can be used to provide ions to a further analytical system. The system is particularly suitable for supplying ions for soft landing in the further analytical system, e.g. an electron microscopy system. The mass spectrometer (100) is based on a layout used in the Thermo Scientific™ Q Exactive™ series of instruments (Thermo Fisher Scientific Inc.) utilising a hybrid configuration of a quadrupole mass filter and an electrostatic trap mass analyser in the form of an Orbitrap mass analyser.

The mass spectrometer (100) comprises an atmospheric pressure electrospray ion source (102) to form ions from a supplied sample. The sample can contain biopolymers (DNA, proteins etc.) as described above. The sample can be a liquid sample that is provided as a function of time, for example by elution from a chromatographic separation system (not shown) or other liquid-phase separation. For example, the sample can be a liquid sample that is provided by size-exclusion chromatography, capillary electrophoresis, solid-phase extraction, liquid chromatography, affinity separations, or other liquid-phase separations. It will be appreciated that other ion sources could be used depending on the type of sample. For example, the invention could also be used for analysis of ions produced by matrix-assisted laser desorption/ionisation (MALDI), laserspray or any other inlet ionisation, or indeed any other techniques capable of producing high-m/z ions, such as ions of the biopolymers described.

Ions from the electrospray pass through a heated ion transfer capillary (104) to a stacked ring ion guide (SRIG or S-lens) (106) and then through an injection flatapole (110) and a bent flatapole (114). The S-lens region is pumped by a vacuum pump and is typically at 1-10 mbar. A pressure gradient draws ions into the ion transfer capillary in the atmospheric pressure region and transports them to the S-lens region. An RF voltage is applied to the electrodes of the S-lens (106) to focus the ions toward the opening of an exit lens (108). Ions from the S-lens pass (106) through the exit lens (108) and move toward the injection flatapole (110), which is an array of flat metal electrodes that acts as an ion focusing device. A focusing RF and a DC offset voltage are applied to the injection flatapole. The injection flatapole (110) is pumped by a first stage of a first turbomolecular pump (TMP) (not shown). The ions then pass through an inter-flatapole lens (112), which is a metal plate with a small hole through which the ion beam can pass. A DC potential is applied to the lens to aid in ion transmission. The ions enter the bent flatapole (114), which acts as an ion transmission device. It guides the ions through a 90° arc from the injection flatapole (110) to the quadrupole mass filter (130) and removes the neutral gas jet and solvent droplets passing through the S-lens and injection flatapole. Because of the bent shape of the flatapole (114), the neutral particles cannot follow the bent path of the flatapole. The bent flatapole is pumped by a second stage of the first TMP. An exit lens 116 focuses the ion beam into the quadrupole mass filter (130).

The quadrupole (130) is a square array of precision-machined and precision-aligned hyperbolic-profile round rods acting as electrodes. The quadrupole (130) can be operated in (RF-only) full transmission mode to allow ions of a full range of mass-to-charge ratios to pass, or as a mass filter with RF and DC voltages applied to the rods, which are connected as pairs of opposite rods. Voltages of the same amplitude and sign are applied to the rods of each pair. However, the voltages applied to the different rod pairs are equal in amplitude but opposite in sign. The voltages are chosen so that the quadrupole (130) selects ions of a desired mass-to-charge ratio or range of mass-to-charge ratios to pass. The quadrupole (130) is pumped by a further stage of the first TMP.

From the quadrupole (130), the selected ions pass through a split lens (118) and transfer multipole (120) and enter a curved linear ion trap (C-trap) (140) comprising RF electrodes typically at a pressure of $(0.1-1) \times 10^{-3}$ mbar. Ions can be collected and cooled in the C-trap (140). Optionally the ions may be passed for further cooling into a gas-filled collision cell (150) comprising RF multipole rods typically. From cell (150) the ions can be passed back into the C-trap (140) using an axial electric field. Voltages on end apertures of the C-Trap (entrance and exit apertures 122, 124 respectively) are elevated to provide a potential well along its axis. The ions in the C-trap (140) lose kinetic energy in collisions with a bath gas, such as nitrogen, and collect near the middle part of the C-Trap. If required, an axial field provided by a voltage offset can be applied to the collision cell (150) to provide for fragmentation of ions therein. If the collision cell (150) is not required for cooling or fragmentation of ions, it may be pumped at a lower pressure (e.g. $3 \times 10^{-6}$ mbar).

The ions can be injected orthogonally (radially) from the C-trap (140) through a slot in the C-trap into an electrostatic orbital trapping mass analyser (Orbitrap mass analyser) (160) by switching off RF and applying a DC voltage pulse to the C-trap. Lenses between the C-Trap (Z-lens 144) act as differential pumping slots and cause spatial focusing of the ion beam into the entrance of the Orbitrap mass analyser. Ions are electrostatically deflected away from the gas jet by the lens (144), thereby eliminating gas carryover into the Orbitrap mass analyser. The vacuum in the Orbitrap compartment is preferably below $1\times10^{-9}$ mbar (e.g. below $7\times10^{-10}$ mbar) for mass analysis. The regions from C-trap (140) to the Orbitrap (160) can be pumped by further stages of the first TMP or by stages of a second TMP. The Orbitrap mass analyser (160) comprises an axially-symmetrical arrangement of a spindle-shape central electrode surrounded by a pair of bell-shaped outer electrodes and employs an electric field between the central electrode and outer electrodes to capture and confine ions. The confined ions undergo coherent axial oscillations at frequencies that depend on the mass-to-charge ratios of the ions. The two halves of the outer electrode of the Orbitrap analyzer detect an image current produced by the oscillating ions. By Fast Fourier Transformation (FFT) of the amplified image current, the mass spectrometer obtains the frequencies of the axial oscillations and from this the mass-to-charge ratios of the ions. In this way, the mass spectrometer can utilise the Orbitrap mass analyser (160) to check or validate the mass-to-charge ratio of ions being supplied to the further analytical system (electron microscope) as further described below.

Alternatively to trapping the ions in the C-trap (140), the ions can pass the C-trap and the collision cell (150) to a first multipole ion guide (Quad 1, 170), which is a quadrupole ion guide but can be a higher multipole ion guide (e.g. hexapole or octapole). The first multipole ion guide (170) is held in a chamber pumped to a high vacuum, for example $<1\times10^{-6}$ mbar, by connection to a pumping port (171) of a further turbomolecular pump (TMP). The ions pass to a second multipole ion guide (Quad 2, 172), which is a quadrupole ion guide but can be a higher multipole ion guide, held in a chamber pumped to a high vacuum, for example $4\times10^{-8}$ mbar, by connection to a pumping port (173) of the further TMP. Finally, the ions pass to a third multipole ion guide (Quad 3, 174), which is a quadrupole ion guide but can be a higher multipole ion guide, held in a chamber pumped to ultra-high vacuum (UHV), for example $1\times10^{-10}$ mbar, by connection to a further pumping port (175) of the further TMP. RF voltages applied to the multipoles focus the ions as they pass through. High vacuum pumping ports (171, 173) may be configured for lower pumping speeds (e.g. 50 L/s) than UHV pumping port (175) (e.g. 300 L/s). Apertures (178), known as differential pumping apertures (DPAs), lie between the chambers of the first and second multipoles and between the second and third multipoles to separate the vacuum stages. Each of the high vacuum and ultra-high vacuum chambers housing the first, second and third multipoles also might house a respective ion gauge (180, 182, 184). The third multipole (174) passes the ions to a further analytical system. In the shown embodiment, the third multipole (174) passes the ions to ion optics (188) for soft landing the ions onto a substrate (190) for analysis by an electron microscope or electron holography (300). The ion optics (188) may comprise retarding voltage optics, such as a retarding lens, biased to reduce ion energy for soft landing. The substrate (190) can be moved on a translation stage (not shown) to an analysis position of the electron microscope. A gate valve (186) can be operated to isolate the mass spectrometer and electron microscope environments from each other, e.g. during analysis using the electron microscope, or when performing maintenance of either system that requires breaking the vacuum.

Figure 3:
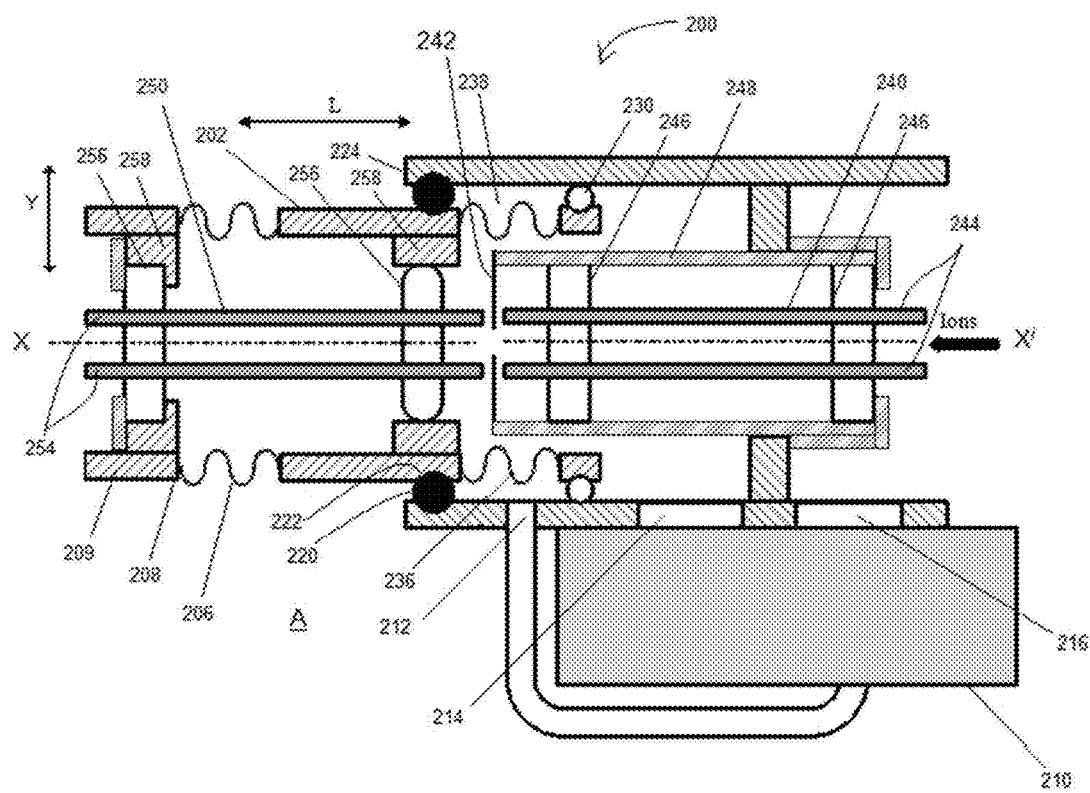
FIG. 3 shows schematically an embodiment for coupling vacuum-based analytical systems enabling vibrational isolation and relative movement of the systems.

FIG. 3 shows schematically an embodiment for coupling the mass spectrometer 100 to the electron microscope 300. A coupling 200 is shown that is suitable for connecting first and second analytical systems, which typically are held under vacuum during their operation and one system is required to be vibrationally isolated. The coupling is therefore compatible with maintaining vacuum conditions inside the analytical systems. A problem with connecting certain analytical systems, such as the systems shown in FIGS. 1 and 2, is that vibrations need to be decoupled between the systems. For example, a mass spectrometer system is pumped typically by turbomolecular pumps that generate vibrations that are sufficiently intense to affect the performance of an electron microscope system, especially a high resolution electron microscope. A further problem exists in that, in use, vertical displacement may need to occur between the two analytical systems. This is particularly problematic with ion optical designs in which ion optics provide an ion optical path along a substantially horizontal path or line from the first analytical system (e.g. mass spectrometer) to the second analytical system (e.g. electron microscope system) as the displacement can cause bending of ion optics and excessive angular misalignment of the ion optics (multipoles) leading to unacceptable increased radial energy spread of the ion beam. The present disclosure addresses these problems.

The coupling (200) comprises a tubular cylindrical connector (202) having a longitudinal axis (X). The axis runs lengthwise (i.e. end-to-end) through the centre of the connector. The connector 202 has a flexible portion in the form of a bellows (206) at a first end of the connector, which is connected to an opening or port (208) of a vacuum tube (209) of the analytical system (electron microscope) requiring isolation from vibrations. The bellows can be made of thin stainless-steel sheets welded together in vacuum.

The bellows (206) can be connected to the port (208) on the first analytical system, for example by a flange (not shown) that can fix (e.g. with bolts) to a flange on the port (e.g. with a vacuum seal between, such as a UHV metal seal). For example, connection of the bellows to the port can be by Conflat (CF) flanges. In a more permanent connection embodiment, the bellows (206) could be welded to the port (208) of the system. It will be appreciated that other connections are possible, provided they are vacuum compatible connections (vacuum sealed), preferably HV or UHV compatible.

The bellows (206) dissipates vibrations from the mass spectrometer and reduces or prevents their transmission to the electron microscope system. The source of the vibrations from the mass spectrometer is one or more vacuum pumps, one of which, a multi-port turbomolecular pump (210) is shown. Multiple pumping ports (212, 214, 216) of the pump are also shown, which pump different stages of the vacuum. The bellows (206) allows displacement of the connector in the direction of the longitudinal axis (X). The bellows (206) also allows displacement of the first end of the connector in a direction (Y) transverse to the longitudinal axis (X) caused by a displacement in this direction of the analytical system (e.g. electron microscope) of which vacuum tube (209) is part.

A first radial seal (220), in the form of an O-ring, sits in a circumferential (radial) groove (222) in the outer surface of the connector 202. The first seal (220) is provided at a position on the connector separated from the bellows (206) for sealing between the connector (202) and an opening or port (224) of the second analytical system (e.g. mass spectrometer). The opening or port (224) is preferably cylindrical and of greater inner diameter than the outer diameter of the connector (202) such that the seal (220) provides a seal therebetween. The first seal (220) seals provides sealing against atmospheric pressure (A) outside the analytical systems. The first seal (220) and locating groove (222) is located at or proximate to a second end of the connector, opposite (distal) to the first end with the bellows (206). The first radial seal (220) allows displacement of the first end of the connector in a direction (Y) transverse to the longitudinal axis (X), for example when stress on the bellows exceeds a limit.

A second radial seal (230), in the form of an O-ring (or alternatively C-ring), is provided separated from the first seal (220), at a position on the connector further from bellows (206) than the first seal (220). The second radial seal (230) sits in a circumferential (radial) groove (232) in the outer surface of the connector 202. The second seal provides sealing between the connector (202) and the opening or port (224) of the second analytical system (mass spectrometer). The second seal (230) seals against the internal vacuum of the analytical systems. Further seals can be provided if required. The at least two seals provide sealing from atmosphere to the high (HV) or ultra-high (UHV) vacuum region of the analytical systems.

The connector (202) comprises a second flexible portion in the form of a second bellows (236) between the first seal (220) and the second seal (230). Thus, the second seal (230) is further vibrationally isolated from the vibrationally isolated side of the system. In the shown embedment, the second bellows (236) occupies most of the length of the connector between the first seal (220) and the second seal (230). The bellows (236) can be made of thin stainless-steel welded together in vacuum.

The first seal (220) and second seal (230) are preferably metal-free, i.e. non-metal seals. The first and second seals preferably do not create metal-to-metal contact, i.e. between the systems. Preferably, the seal (e.g. first and second seals) provide electrical isolation between the connected systems to avoid ground loops. Thus, preferably, in the coupling both seals are not electrically conductive.

The first and second seals have different stiffness to each other. The first seal (220), which is nearest to atmosphere, has a higher stiffness than the second seal (nearer to vacuum) as it needs to withstand the highest pressure differential. In the shown embodiment, the first seal (220) is an elastomer seal in the form of a Viton O-ring, while the second seal (230) is a low-outgassing polymer seal in the form of a polytetrafluoroethylene (PTFE) O-ring seal or C-ring seal. A polymer seal has a lower compression/deformation and serves mainly to block the line of sight between the inter-sealing space and (ultra) high vacuum side. Where the area facing a UHV region is small, polymer sealing, such as PTFE sealing, is known to be compatible with pressures down to $10^{-9}$-$10^{-10}$ mbar, which is sufficient for most applications, including soft landing of ions and/or electron microscopy. The inter-sealing space or volume (238) between the first and second seals is differentially pumped by one of the ports (212) of the turbopump (210), e.g. at a pressure $10^{-5}$ mbar.

The embodiment shown in FIG. 3 shows two vacuum stages, containing respectively two multipoles of an ion optical system. One of the multipoles, referred to in this embodiment as the input multipole (240), resides in HV (e.g. $10^{-8}$ mbar) and the other multipole, referred to in this embodiment as the output multipole (250), resides in UHV ($<10^{-9}$ mbar). The input and output multipoles (240 and 250) could, for example, be the Quad 2 (172) and Quad 3 (174) of the system shown in FIG. 2, or could be the Quad 1 (170) and Quad 2 (172). The multipoles (240, 250) are quadrupoles in this embodiment but can be implemented as, e.g., quadrupoles, hexapoles, octapoles, generally as 2*N-poles (N is an integer, typically 2, 3 or 4), with one phase of RF voltage applied to all odd poles and the other phase of RF applied to all even poles.

The multipoles (240, 250) ensure the transport of ions from the mass spectrometer to the vibrationally isolated system with minimal ion losses. The ion optical system of multipoles (240, 250) provides a horizontal ion optical axis, passing through the central axis of the multipoles, which is substantially aligned with the longitudinal axis (X) of the connector (202). Thus, the ion optical axis of ions traveling in direction X' between the analytical systems passes through the centre of the connector (202). In addition to the connector (202) housing ion optics for guiding ions, such as the shown multipoles, the connector can optionally house additional ions optics for focusing ions, such as one or more ion lenses (242) located between the multipoles.

The multipole (240) comprises rods (244) as the poles or electrodes, which are held apart and in (parallel) alignment by dielectric supports (246) in the form of rings that support the rods near their ends. The dielectric supports are made of an electrically insulating material, such as ceramics or quartz or plastic. The dielectric supports (246) are mounted inside a housing (248), which itself is mounted inside the high vacuum stage of the mass spectrometer. The output multipole (250) is mounted inside the connector (202). The multipole (250) again comprises rods (254) as electrodes, which are held apart and in alignment by dielectric supports (256) in the form of rings that support the rods near their ends. The dielectric supports (256) are mounted or seated on seats (258), one of which is fixed to, or integral with, or otherwise connected to the inside of the connector (202), and the other is fixed to the port (208) of the vibration-isolated analytical system (electron microscope or MSI). As described, the multipoles (240, 250) ensure the transport of ions with minimal losses. However, it will be appreciated that, in other embodiments, there may be a different ion optical system or an ion optical system may not be present in the coupling.

It can be necessary for the vibrationally isolated analytical system, such as an electron microscope system, to employ active platforms and/or passive air tables, which cause the system to move vertically, i.e. up and down, relative to the other system. This displacement, which can be up to several millimetres (mm), will deform the bellows of the coupling on both sides of the first seal (220) and cause rotation of the output multipole (250) relatively to its seat (258) near the first seal (Viton O-ring). There is no strict requirement to have the first seal (220) in the same plane as the centre of rotation and/or the multipole seat (258) but this is preferred in order to minimize bending stresses on the vacuum tube (209) on the vibrationally isolated side. At least one of the output multipole dielectric supports (256), the one closest to the first seal (220), is made rounded and preferably polished on its surface (257) that contacts its seat (258) so that rotation of the multipole takes place smoothly. That dielectric support (256) is also located close to the end of the output multipole to minimize shifting of the rod ends, preferably located near to or in the same plane as the centre of rotation of the multipole and/or the first seal (220) (i.e. substantially in the same plane as the centre of rotation of the multipole and/or the first seal).

The differential pumping between the first and second seals (220, 230) allows the compression of the Viton O-ring to be reduced from typically 20-30% to, e.g., 10-15%. This makes it softer and more deformable, thereby increasing the damping of vibrations that arrive from the other (mass spectrometer) side. Preferably, the O-ring cord of the first seal is chosen to be slightly oversized, e.g. with an OD 6 to 10 mm.

The O-ring of the first seal ensures rough alignment of the ion optics but a finer alignment of the ion optical path can be achieved by using correcting ion optics for correcting the ion beam. In one embodiment, shown in FIG. 5, the lens (242) between the multipoles could be made of four quadrant deflector electrodes: a top/bottom pair (243, 243') for vertical displacement of ions, and a left/right pair for transverse displacement of ions passing through in the direction of axis X. In some cases, independent adjustment of the ion beam can be arranged on either side of the instrument. For example, the rods of the input (240) and/or output (250) multipoles could have independent DC voltages applied to them to shift the ion axis as required during tuning. It is preferable to have ion deflection capabilities incorporated into the lens (242) located between the input and output multipoles (240, 250). For a thin lens with quadrants, only a few Volts may be applied to the electrodes.

Figure 4:
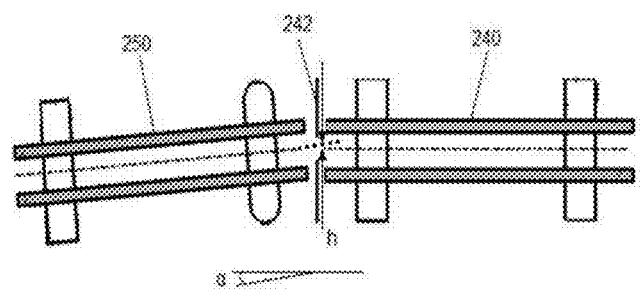
FIG. 4 shows schematically an angular misalignment, a, of ion optics caused by relative vertical displacement of the analytical systems.

An angular misalignment a of the output multipole to the input multipole (angular deviation between the output multipole axis and the input multipole axis), as shown in FIG. 4, will not significantly affect parameters of the outcoming beam of ions having charge state z if an additional radial energy spread due to misalignment is small in comparison with the radial energy spread of the incoming ion beam. As the latter has a lower limit at kT, (k is Boltzmann constant), then $$\alpha \le \sqrt{\frac{kT}{zeV}}$$

where V is the voltage difference between the voltage offset of the output multipole and the last gas-filled multipole emitting ions (i.e. the acceleration voltage of ions incoming to the output multipole), and e is elementary charge. The last gas-filled multipole may be the HCD cell (150), for example, in FIG. 2. As an example, for a protein with z=25 and for typical conditions of room temperature (T=300 K) and V=10 V, we obtain requirement α<10 mrad. Therefore, for a maximum vertical misalignment or displacement between two systems of the instrument, H, the length L between the centres of the bellows (206) on the vibrationally isolated side and the rotating dielectric support (256) should be L>H/α. For the example above, H=1 mm, L>100 mm (i.e. L>100*H). Generally, therefore, the length L is such that for the maximum transverse displacement (e.g. vertical displacement for a horizontal optical axis) of the system, a resulting angular misalignment of the multipoles causes an additional radial energy spread of the ions that is smaller, and preferably much smaller, than the added radial energy spread of the incoming ion beam (coming into the output multipole), e.g. <50%, <40%, <30%, <20%, <10%, <5% of the radial energy spread of the incoming ion beam.

Meanwhile, the vertical misalignment between the multipoles, h, could be neglected if it is smaller, particularly significantly smaller, than the radial size of the ion beam (r), which for a quadrupole ion guide can be estimated as $$r = \sqrt{\frac{4kT \cdot M/z}{m_{min} \cdot V_{RF}}}$$

where $m_{min}$ is the low-mass cut-off of the quadrupole guide, $V_{RF}$ is amplitude of the RF voltage and M/z is the mass-to-charge ratio of an ion of interest. For example, the vertical misalignment between the multipoles, h, can be neglected if it is <50%, <40%, <30%, <20%, <10%, <5%, of the radial size of the ion beam (r). The vertical misalignment between the multipoles, h, due to the displacement of the analytical system is, therefore, desired to be generally less than these limits.

Figure 5:
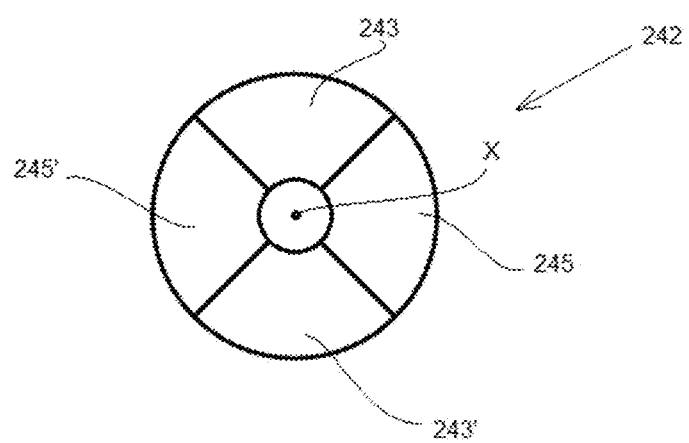
FIG. 5 shows schematically an embodiment of a lens for correcting an ion beam position.
Figure 6:
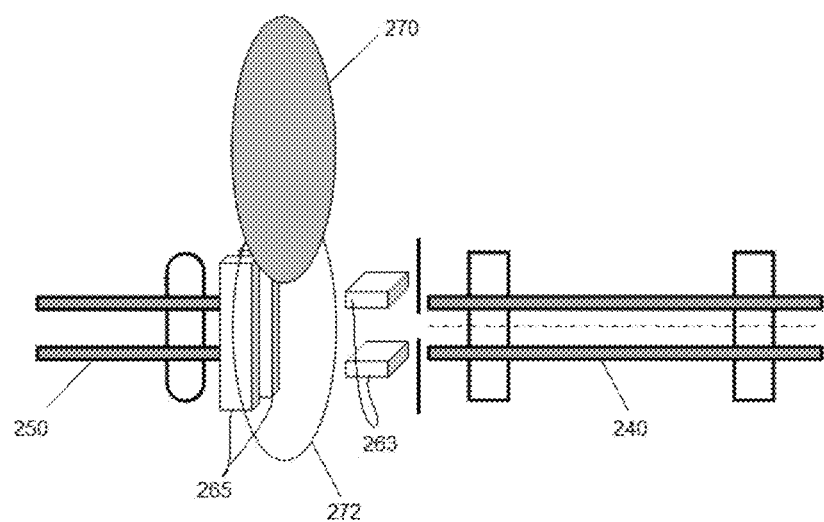
FIG. 6 shows schematically another embodiment of deflector system for correcting ion beam position.

Either H or h can be compensated with the use of a single deflector between the multipoles (240, 250), for example within the lens (242), but compensation of both would require at least two deflectors between the multipoles. This can be arranged as shown in FIG. 5, with vertical and transverse deflectors, which is the shortest system. Another possible deflector system is shown in FIG. 6 and comprises a pair of vertical deflectors (263) and a pair of transverse deflectors (265), which are longitudinally separated so that a gap exists between the pairs (263, 265) allowing, for example, a gate valve (270) to be positioned between them (gate valve sealing seat (272) is also shown). Although this is undesirable from the viewpoint of increased losses, such an embodiment may be appropriate if a gap between the multipoles is required anyway by the system design, for example to accommodate a gate valve to separate the vacuum systems of the respective analytical systems.

An alternative approach to enable consistent alignment of multipoles in spite of relative movement of systems, could be the use of flexible PCB-based ion tunnels as described in U.S. Pat. Nos. 10,460,920 and 10,720,315. However, the use of so many PCBs is not always acceptable under HV and UHV conditions.

Figure 7:
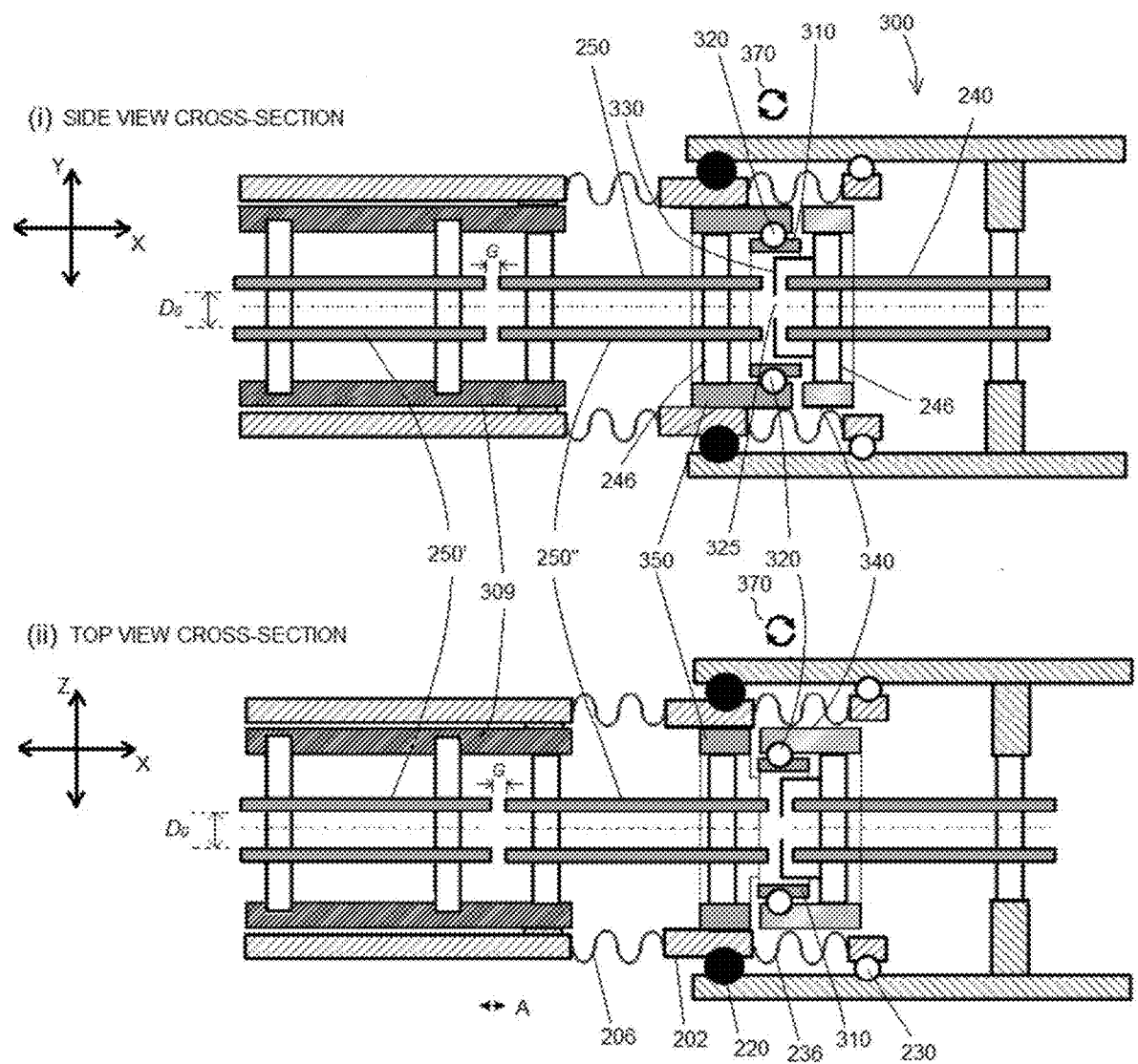
FIG. 7 shows schematically another embodiment for coupling vacuum-based analytical systems enabling vibrational isolation and relative movement of the systems.

For the case of HV and UHV conditions, a further alternative embodiment that enables precise alignment of multipoles in spite of relative movement of systems, is shown schematically in FIG. 7. FIG. 7 shows a side cross-section view (i) and a top cross-section view (ii). Where the same parts are used as in FIG. 3, the same references numerals are used. The design of FIG. 7 embodies the principle of a Cardan or Universal joint (300) (https://en.wikipedia.org/wiki/Universal_joint) and allows mutual rotation of multipoles about two orthogonal axes without losing alignment. In this embodiment, two shafts, in the form of a first hollow cylindrical shaft (340) and second hollow cylindrical shaft (350), are attached respectively to the adjacent ends of the input and output multipoles (240 and 250). The shafts are located about the dielectric supports (246) of the multipoles, thereby supporting the ends of the multipoles. The second shaft (350) fits within the connector (202). The shafts (340 and 350) are accurately aligned and connected to a central yoke ring (310), e.g. by centering balls (320), preferably ceramic or metal balls, preferably with tolerances of not more than a few tens of microns. Two centering balls are located on each orthogonal axis of rotation (Y axis and Z axis), so there are four balls in total. The shafts (340, 350) are able to move relative to each other about the orthogonal axes and to the yoke (310) by means of the centering balls (320). To aid vibration isolation, the yoke and/or shafts could be made from PTFE, PEEK or other vacuum-compatible plastics. Also, the shafts could be implemented to feature sharp changes of shaft cross-section (e.g. grooves) as an additional measure to reduce transmission of vibrations. Preferably, both axes of rotation come through the centre of the lens aperture (325) of lens (330) to minimise h. To allow longitudinal (X direction) shifts shown by double-headed arrow A, due to movement of the bellows (206), the output multipole (250) could be constructed as two parts, with one part (250') rigidly fixed to the corresponding analytical system and another part (250") connected to the Cardan joint and being longitudinally moveable relative to the first part. For example, the first part of the multipole (250') can be fixed within a housing (309), such as a cylindrical housing, e.g. by fixing the dielectric supports of the multipole to the wall of the housing. The second part (250") may be arranged with its end adjacent the first part (250') located within the housing (309) in a polished sliding fit. Although they could have the same RF supply, the gap (G) between two multipoles parts (250', 250") could be varied to accommodate shifts between systems. As long as this shift is significantly less than the inscribed multipole diameter $D_0$, no ion losses or scattering is expected.

Figure 8:
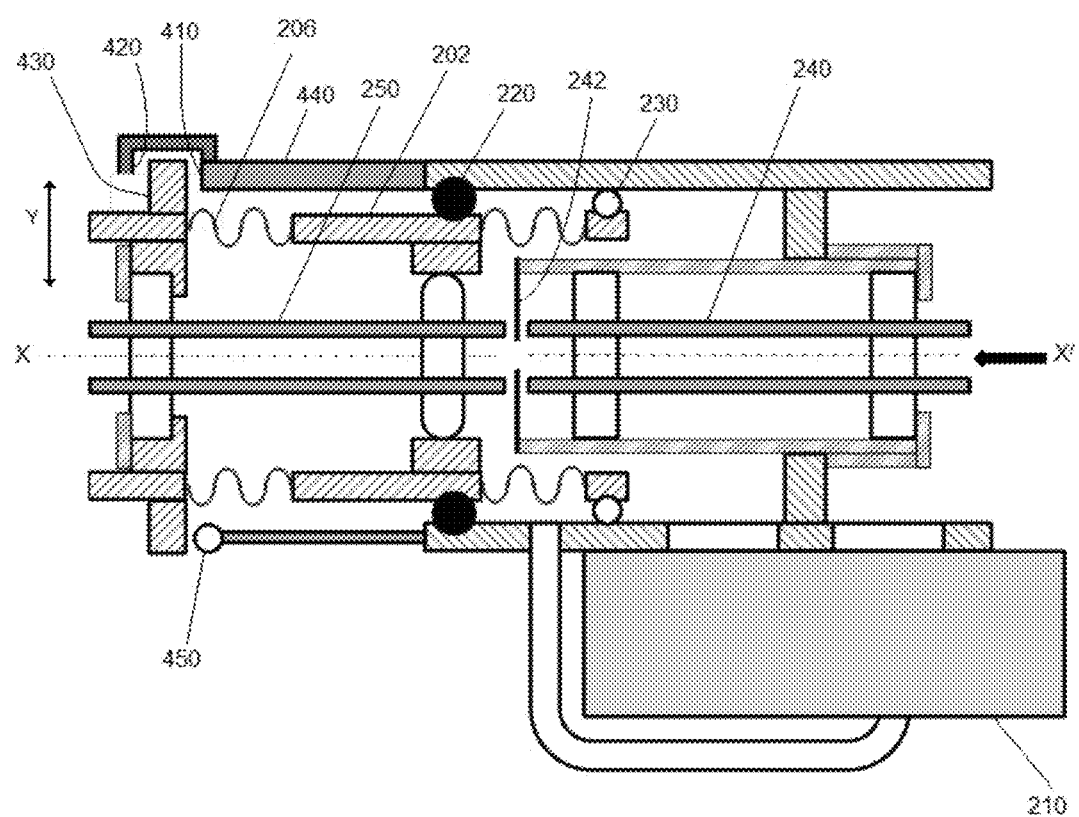
FIG. 8 shows schematically a further embodiment for coupling vacuum-based analytical systems enabling vibrational isolation and relative movement of the systems.

Another embodiment is shown schematically in FIG. 8. The embodiment is similar to the embodiment shown in FIG. 3 with many of the same components but with the following modifications. As the connector (202) has flexible portion (206), which allows significant longitudinal (X) travel, precautions are needed to avoid collision of multipole (250) with lens (242). Practically, this can be implemented with the help of one or more hard stops (410, 420) shown in FIG. 8. These stops can be arranged to limit either maximum compression (stop 410) or maximum extension (stop 420) of the flexible portion (206) or both. A radial protrusion or flange (430) in this embodiment is arranged on the end of the analytical system to which the connector or flexible portion is connected. The radial protrusion or flange (430) physically engages against the hard stops (410, 420), which are arranged either side of the radially protrusion or flange (430), the hard stops being connected to the other analytical system, in this case by a connecting member (440). Optimum distance between multipole (250) and lens (242) could be set during installation of the system and then controlled using one or more proximity sensors (450), as shown in FIG. 8. The proximity sensor(s) (450) could comprise spring contacts, or capacitive, inductive, magnetic, optical and/or other sensing. The main requirement is that sensor(s) do not create a path for vibrations, i.e. that they preferably create no contact between systems or not more than a low-force spring-loaded contact. When the proximity sensor(s) sense that the systems are in contact, or close to being in contact, a signal can be sent from the sensor(s) to a controller, which can stop an analytical measurement and/or initiate a position adjustment of at least one of the systems (which position adjustment could also be performed manually in some embodiments), to avoid detrimental transmission of vibrations between the systems during an analytical measurement. The features of the hard stop and/or proximity sensors can also be used with the embodiment shown in FIG. 7. It will be appreciated that the system overall can incorporate other known means of vibration reduction, such as the use of bellows between the vacuum pump ports and the vacuum chambers of the analytical systems.

Although the disclosure has generally referred to examples in which an imaging system is the first analytical system and a mass spectrometer is the second analytical system, in other embodiments the mass spectrometer can be the first analytical system and the imaging system can be the second analytical system.

It will be appreciated that the analytical systems can comprise:
  existing mass spectrometer systems or architectures as the front end to generate and select ions, such as those based on: orbital trap mass analysers (e.g. Orbitrap mass analyser), Hybrid quadrupole-orbital trap mass analysers, Tribrid quadrupole-orbital trap-linear ion trap mass analysers, Tribrid quadrupole-orbital trap-time of flight (ToF) mass analysers, Triple quadrupole mass analysers, Quadrupole-Time-of-flight (Q-ToF) mass analysers, etc.
  existing electron microscopy systems as the back end to receive and image the ions, such as: SEM, TEM, electron holography, diffractometry, etc., including such systems designed to utilise ion soft landing for sample preparation, for example using a graphene sample support for soft landing
  imaging mass spectrometry as the front end (i.e. the system that receives the sample) to produce ions for mass spectrometry analysis in the other analytical system. Such system could utilize ion or electron beams to produce secondary ions or laser desorption or ablation, either with or without using matrix. Multi-stage ionisation methods, e.g. with laser or electron post-ionisation, are also possible.
  Cryogenic cooling at one or more stage of analysis (mass spectrometry and/or electron microscopy stages).

In general, the substrate or support for ion soft landing preferably should be electron transparent (e.g. electron transparent at energies less than 200 eV for electron holography and 50-300 keV for EM), ultra-clean, non-reactive and conductive. In some embodiments, the material used for the substrate is a two-dimensional (2D) material. Example (2D) materials for the substrate include single- or double-layer graphene, hexagonal boron nitride (hBN), molybdenum disulfide, tungsten diselenide, and hafnium disulfide.

It will be appreciated that the analytical systems can be suitable for analysis of biopolymer analytes such as DNA, RNA, peptides, proteins with or without post-translational modifications, complexes of proteins, DNAs, RNAs or their combinations (such as a ribosome in native state), as well as more complex arrangements such as lipid rafts, micelles, regions of cell membrane, etc., intact viruses etc. In some embodiments, the sample is a protein, such as lysozyme, calmodulin, protein A/G, OmpF porin (an outer membrane protein of *Escherichia coli*), monoclonal antibody immunoglobulin (IgG), C-reactive protein (CRP), streptavidin, and human serum albumin, to name a few. In embodiments where the sample is a protein, it may be desirable that the protein be in a desired native-like state after preparation and mass filtering. The system preferably generates ions of one or more biopolymers of the foregoing types. The identity of the analyte may be validated by the mass analyser of the system (e.g. Orbitrap mass analyser, ToF mass analyser etc.) or additional spectroscopy means. The foregoing list of sample types is included as illustration only and is not limiting to the disclosure. Ions can be generated from the analytes in the mass spectrometer by any suitable ion source, such as (nano)electrospray, inlet ionization, MALDI, desorption electrospray ionization, ambient ion sources, etc.

It will be appreciated from the foregoing description that the present disclosure enables vibrational decoupling between two systems without metal-to-metal contact between the systems. Embodiments of the present disclosure relate to a coupling for connecting a mass spectrometer and other vacuum-based instruments, particularly vibration sensitive analytical instruments, such as electron microscopes, for example scanning and transmission electron microscopes (SEM/TEM), i.e. in a hybrid MS/TEM or MS/SEM configuration. However, it will be appreciated that the coupling is applicable to connecting any analytical systems that require vibrational isolation and particularly systems that are vacuum-based and/or require relative displacement during use. Embodiments of the disclosure provide vibrational decoupling whilst also accommodating relative displacement between the systems. Misalignment between ion optics caused by relative displacement between the systems is minimised so as to minimise energy spread of an ion beam. The coupling allows existing MS systems or infrastructure to be utilized by allowing an (ultra)-high vacuum ion path from the MS system to an EM system for example.

As used herein, including in the claims, unless the context indicates otherwise, singular forms of the terms herein are to be construed as including the plural form and vice versa. For instance, unless the context indicates otherwise, a singular reference herein including in the claims, such as "a" or "an" means "one or more".

Throughout the description and claims of this specification, the words "comprise", "including", "having" and "contain" and variations of the words, for example "comprising" and "comprises" etc., mean "including but not limited to" and are not intended to (and do not) exclude other components.

It will be appreciated that variations to the foregoing embodiments of the disclosure can be made while still falling within the scope of the disclosure as defined by the claims. Each feature disclosed in this specification, unless stated otherwise, may be replaced by alternative features serving the same, equivalent or similar purpose. Thus, unless stated otherwise, each feature disclosed is one example only of a generic series of equivalent or similar features.

The use of any and all examples, or exemplary language ("for instance", "such as", "for example" and like language) provided herein, is intended merely to better illustrate the disclosure and does not indicate a limitation on the scope of the disclosure unless otherwise claimed. No language in the specification should be construed as indicating any non-claimed element as essential to the practice of the disclosure.

The invention claimed is:

1. A coupling for connecting together vacuum-based analytical systems requiring to be vibrationally isolated, comprising:
   a tubular connector having a longitudinal axis, the connector comprising a first end for connection to a first analytical system and a flexible portion for reducing transmission of vibrations and permitting displacement of the first analytical system in a direction transverse to the longitudinal axis of the connector; and
   a seal longitudinally separated from the flexible portion, for vacuum sealing between the connector and a second analytical system;
   wherein the connector contains ion optics for transmitting ions between the first and second analytical systems.

2. A coupling according to claim 1, wherein the flexible portion is located at or near the first end of the connector.

3. A coupling according to claim 1, wherein the flexible portion is a bellows.

4. A coupling according claim 1, wherein the seal is located at or near a second end of the connector opposite from the first end.

5. A coupling according to claim 1, wherein the seal is for sealing between atmospheric pressure outside the analytical systems and a high or ultra-high vacuum inside the analytical systems.

6. A coupling according to claim 5, wherein the seal comprises a first seal and a second seal, the second seal being further from the flexible portion than the first seal, wherein the first seal is for sealing against atmospheric pressure and the second seal is for sealing against the high or ultra-high vacuum.

7. A coupling according to claim 6, wherein a space between the first and second seals is configured to be differentially pumped to a pressure that is intermediate between atmospheric pressure and the vacuum inside the analytical systems.

8. A coupling according to claim 6, wherein the flexible portion is a first flexible portion and the connector further comprises a second flexible portion, which is located between the first seal and the second seal.

9. A coupling according to claim 8, wherein the second flexible portion is a bellows.

10. A coupling according to claim 6, wherein the first and second seals do not create metal-to-metal contact and/or the first and second seals are both not electrically conductive and/or the first and second seals are O-rings.

11. A coupling according to claim 6, wherein the first seal has a higher stiffness than the second seal.

12. A coupling according to claim 6, wherein the first seal is an elastomer seal, preferably Viton and/or the second seal is a polymer seal, preferably PTFE.

13. A coupling according to claim 1, wherein the ion optics comprise a multipole for guiding ions.

14. A coupling according to claim 13, wherein one end of the multipole is rotatably supported inside the connector and the other end of the multipole is supported inside the first analytical system.

15. A coupling according to claim 14, wherein a centre of rotation of the multipole lies on the longitudinal axis of the connector at a position near to or in the same plane as the first seal.

16. A coupling according to claim 14, wherein the one end of the multipole is connected to a further multipole by a Cardan joint.

17. A coupling according to claim 13, wherein the end of the multipole supported inside one of the analytical systems is located with a sliding fit within a housing of that analytical system.

18. A coupling according to claim 1, wherein relative movement between the analytical systems in the longitudinal direction is controlled by means of one or more stops and/or one or more proximity sensors.

19. A coupling according to claim 13, wherein a distance, L, between the centre of the flexible portion of the connector and the first seal is such that any radial energy spread of ions caused by displacement of the multipole in a direction transverse to the longitudinal axis is less than the radial energy spread of the ions entering the multipole.

20. A coupling according to claim 19, wherein any added radial energy spread of ions caused by displacement of the multipole in a direction transverse to the longitudinal axis is <50%, <40%, <30%, <20%, <10%, or <5%, of the radial energy spread of the ions entering the multipole.

21. A coupling according to claim 1, wherein one of the analytical systems is a mass spectrometer and the other analytical system is an imaging system utilizing charged particles.

22. A coupling according to claim 21, wherein the imaging system is selected from: a TEM, an SEM, an electron holography (EH) microscope, an imaging mass spectrometer (MSI) using secondary ion mass spectrometry (SIMS), and an imaging mass spectrometer (MSI) using lasers, preferably MALDI or MALDI-2.

* * * * *